United States Patent [19]
Boher et al.

[11] Patent Number: 6,073,464
[45] Date of Patent: Jun. 13, 2000

[54] LASER SURFACE TREATMENT DEVICE AND METHOD

[75] Inventors: Pierre Boher, Yerres; Marc Stehle, Meudon, both of France

[73] Assignee: Societe de Production et de Recherches, Bois-Colombes, France

[21] Appl. No.: 09/000,126

[22] PCT Filed: Jul. 3, 1996

[86] PCT No.: PCT/FR96/01034

§ 371 Date: Jan. 16, 1998

§ 102(e) Date: Jan. 16, 1998

[87] PCT Pub. No.: WO97/07539

PCT Pub. Date: Feb. 27, 1997

[30] Foreign Application Priority Data

Aug. 11, 1995 [FR] France .................................. 95 09778

[51] Int. Cl.⁷ .......................... C03B 27/012; C03B 5/24; C03B 5/26; C03B 37/01; C03B 37/018
[52] U.S. Cl. ................................ 65/378; 65/392; 65/441; 65/29.12; 65/29.18; 65/33.2; 65/117; 356/369; 219/121.6; 219/121.61; 219/121.62; 219/121.85
[58] Field of Search .............................. 65/378, 392, 441, 65/29.12, 29.18, 33.2, 111, 117, 102, DIG. 4; 356/369; 219/121.6, 121.61, 121.62, 121.85

[56] References Cited

U.S. PATENT DOCUMENTS

| 4,962,065 | 10/1990 | Brown et al. . | |
|---|---|---|---|
| 5,313,044 | 5/1994 | Massoud et al. | 219/121.85 |
| 5,798,837 | 8/1998 | Aspnes et al. . | |
| 5,858,819 | 1/1999 | Miyasaka . | |
| 5,864,393 | 1/1999 | Maris . | |

FOREIGN PATENT DOCUMENTS

| 0631304 | 12/1994 | European Pat. Off. . |
| 0252262 | 1/1998 | European Pat. Off. . |
| 59-168636 | 9/1984 | Japan . |
| 3295251 | 12/1991 | Japan . |
| 6288835 | 10/1994 | Japan . |
| WO 97/07392 | 2/1997 | WIPO . |
| WO 97/07423 | 2/1997 | WIPO . |
| WO 97/07578 | 2/1997 | WIPO . |

*Primary Examiner*—Stanley S. Silverman
*Assistant Examiner*—Jacqueline A. Ruller
*Attorney, Agent, or Firm*—Christie Parker & Hale, LLP

[57] ABSTRACT

A laser surface method involves applying a laser beam treatment in one or several steps to a series of generally similar surfaces of given depth. Properties of the laser treatment are selected so as to change the physical state of each surface. Ellipsometry measurements are made in a region of the first surface before application of the laser beam treatment to the second surface, so as to obtain a physico-chemical characterization of the first surface. Both the laser beam application and the ellipsometry measurement are conducted under generally similar working conditions, so that the change of the physical state of each surface produced by the laser treatment can be controlled in a real time, in-situ, rapidly and nondestructively.

12 Claims, 4 Drawing Sheets

LASER SURFACE TREATMENT DEVICE AND METHOD

FIELD OF THE INVENTION

The present invention relates to laser surface treatment, and the monitoring thereof.

It finds particular application in the annealing of amorphous silicon samples by excimer laser.

BACKGROUND OF THE INVENTION

In general terms, the purpose of applying a laser beam to a surface is to modify the surface, its structure and its physical state.

In practice, the mechanism involves a partial fusion of the surface, in the case of the crystallization of amorphous silicon.

The Applicant identified a problem of providing a device and a method for monitoring, in real time, on site, both rapidly and nondestructively, a laser surface treatment in which there are at least two generally similar surface fields to be treated, of given depth, to each of which there is to be applied, on one or more occasions, a laser beam treatment, with characteristics chosen so as to change the physical state of each surface field.

The present invention affords a solution to this problem.

SUMMARY OF THE INVENTION

According to a general definition of the invention, the method is characterized by the fact that it effects at least one ellipsometry measurement before at least one of the applications of the laser beam treatment to the second surface field, in at least one area of the first surface field, in order to obtain a characterization of the first surface field, the application of the laser beams and the ellipsometry measurement being performed under generally similar working conditions, which makes it possible to monitor in real time, on site, nondestructively and rapidly, the change in physical field state of each surface field by means of said characterization.

According to one embodiment of the invention, the ellipsometry measurement is spectroscopic.

According to another embodiment of the invention, the ellipsometry measurement is performed at one or several wavelengths.

The optical analysis known as "spectroscopic ellipsometry" normally used in the field of research and development, is known. This type of analysis allows the characterization of a single layer or multilayer stack in a relatively wide range of thicknesses.

It is theoretically possible to use such an optical analysis for monitoring the change in physical state of a surface obtained by laser treatment. However, among other factors, the complexity, the cost of such an analysis, the time required and the size of both the laser and the ellipsometer, is such that persons skilled in the art have not until the present thought of using it in this application, for industrial purposes.

The Applicant observed that it is possible to arrange the analysis field of the ellipsometer to substantially cover (in depth, but at a point) the three-dimensional surface field (often referred to hereinafter as the "surface", in order to simplify) affected by the impact of the laser beam. This opens numerous possibilities for monitoring the laser treatment of different layers of a given surface. In addition, it was observed that this analysis and the laser treatment can be implemented under generally similar working conditions by metrology and/or optical means which are relatively simple and inexpensive, and which facilitate obtaining a reduced bulk, helping to reduce the costs of implementing the method and device of the invention.

In addition, the Applicant observed that the interval of time between two applications of a high-power laser beam makes it possible to effect at least one ellipsometry measurement between laser applications.

The Applicant also observed that physico-chemical characterization by ellipsometry not only allows monitoring, carried out before and/or after the laser treatment, but also allows for the optimization of at least some of the parameters of the laser treatment.

According to the invention, this optimization of the laser treatment takes place according to a predetermined law dependant at least partly on the physico-chemical characterization, before, during or after each step of the laser treatment.

In practice, one of the parameters of the optimization of the laser treatment is the energy applied by the laser beam per unit surface and/or per unit time.

For example, the optimization of the laser treatment consists of adjusting the energy per unit surface and/or per unit time afforded by the laser source in order to obtain a laser beam treatment appropriate to the surface field to be treated, in accordance with the characterization of this field obtained by spectroscopic ellipsometry. More precisely, this adjustment consists of varying the energy of the laser beam, optically and/or mechanically and/or electrically.

Yet another embodiment of the invention is a device for implementing the method described above.

Other characteristics and advantages of the invention will be described in the detailed description of the invention and the drawings.

DETAILED DESCRIPTION OF THE INVENTION

Figure 1:
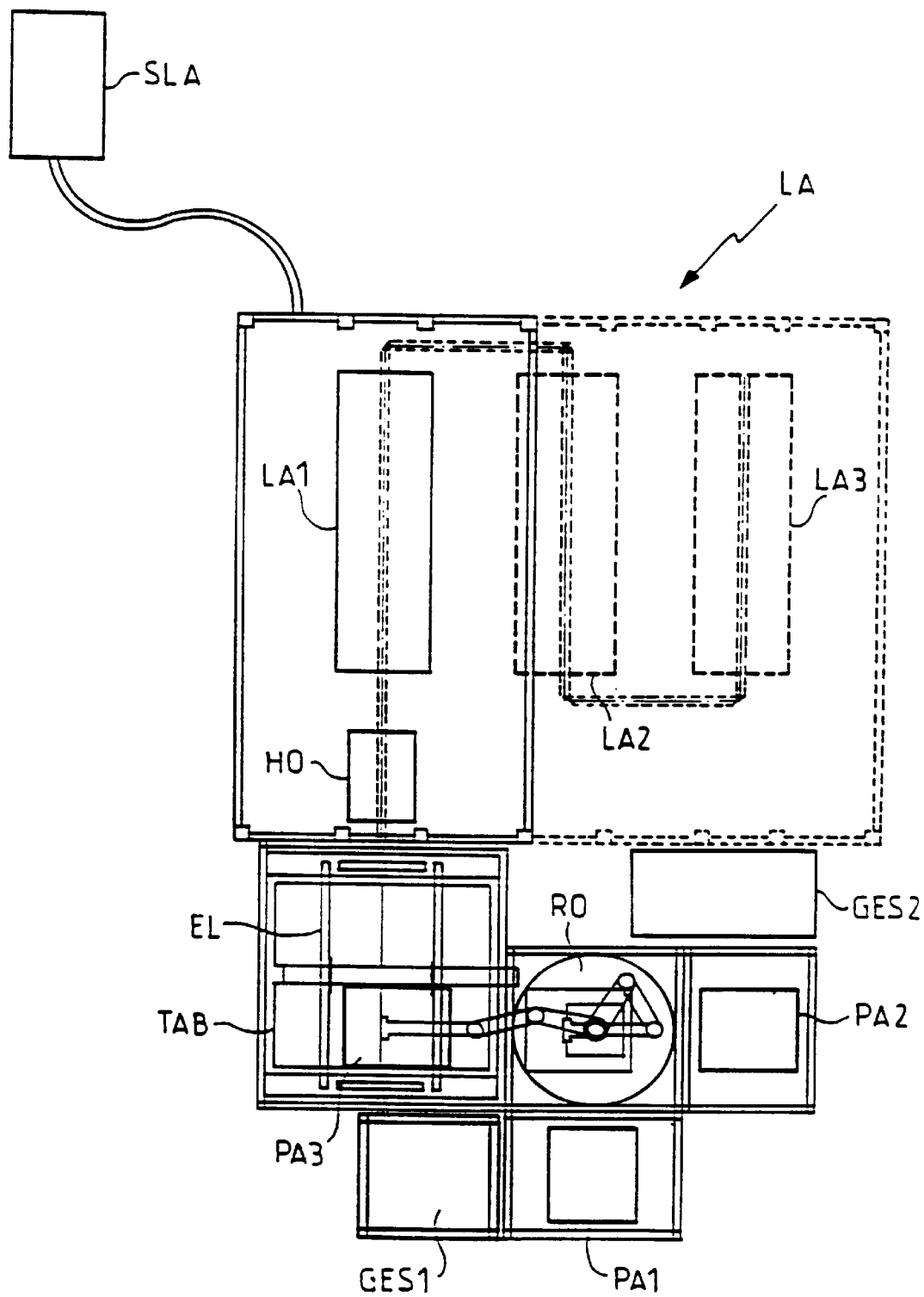
FIG. 1 is an outline diagram of the installation for monitoring the annealing of amorphous silicon panels by excimer laser, according to the invention.

The following description is based, non-limitatively, on a particular application of the present invention which concerns the manufacture of liquid crystal screens with an active matrix, also referred to as AMLCD for "Active Matrix Liquid Crystal Displays", and more precisely the step which consists of manufacturing polysilicon transistors (polysilicon thin film transistor, TFT), necessary both for producing the screen control circuits and the display elements.

The step of manufacturing the transistors determines the performance of the screens, notably the display speed, which is directly proportional to the speed at which the screen control circuits are capable of working and therefore to the mobility of the electrical charge carriers in the material making up the TFT transistors.

The problem associated with the manufacture of polysilicon transistors on large glass substrates is the processing temperature, which must never exceed the critical temperature of the substrate beyond which it loses its properties (essentially mechanical). This temperature is around 600° C. for normal glass substrates (593° C. for CORNING glass reference 7059 F for example).

However, at the present time, it is not known how to deposit polysilicon directly at this temperature. The only known solution consists of depositing a layer of amorphous silicon and recrystallizing it by adding energy to the layer itself without exceeding the substrate destruction temperature. The spontaneous crystallization of the amorphous silicon occurs, at temperatures around 900° C. It is a matter therefore of transmitting sufficient energy to the layer without excessively raising the temperature of the substrate.

A first known solution consists of performing a heat annealing of long duration. More precisely, it is a matter of keeping the polysilicon panels, under a controlled atmosphere, at a temperature just below the substrate degradation temperature (typically 600° C.), for several hours. For example, after twelve hours of annealing, crystallization in the solid phase is obtained. However, such a technique has the drawback of offering limited production capacity. In addition, the performance of the polysilicon thus produced is not optimal in terms of mobility and leakage current of the transistors which will be created thereafter, probably because the solid phase crystallization is never complete here.

Another known solution consists of using the technique known as "rapid thermal annealing", also referred to as RTP, standing for "Rapid Thermal Processing". It is a matter of effecting a rapid thermal annealing at high temperature while limiting the heating of the substrate as far as possible and promoting the temperature rise of the amorphous silicon layer. For example, this preheating is effected by an array of infrared lamps disposed in the vicinity of the polysilicon panels. Constantly kept in movement, the panels are preheated to 500° C., under a nitrogen atmosphere at atmospheric pressure, by an array of infrared lamps, whose energy is absorbed by the glass. Preheating reduces the thermal shock produced by a light beam generated by a high energy xenon lamp, whose energy is preferentially absorbed by the layer of silicon. This additional heating, up to a temperature of around 750° C., is localized on a strip approximately 1 cm wide on the substrate by means of a sophisticated optical focusing system.

Even if this method is fast, the homogeneity of the heat treatment is however difficult to control, especially on large surfaces. In addition, the properties of the substrate can be degraded by an excessively high increase in temperature, due to thermal diffusion.

Finally, a third known solution involves exploiting the particularly strong absorption of silicon in the ultraviolet region, while glass is completely transparent at the same wavelengths. It is a matter of using a pulsed laser beam of high power, making it possible to selectively raise the temperature of the layer of amorphous silicon to its melting point, without effecting the substrate.

The method has the advantage of being able to be carried out very rapidly (the mean duration of a pulse of an excimer laser at 308 nanometers is generally less than 200 nanoseconds). As a result, interference effects of heating of the substrate by thermal conduction are negligible. In addition, the treatment is applied at room temperature without any special precautions at atmospheric pressure In addition, a treatment limited to certain areas of the panel is possible, and it is possible to envisage a hybrid technology on both amorphous silicon and polysilicon.

Such a technology requires notice of two critical points: it is necessary to provide homogeneous laser treatment over large surfaces, and it is necessary to completely control the physical process of fusion/solidification by laser pulses.

In order to ensure a homogeneous treatment over large surfaces, it is known to use an excimer laser of medium power (500 mJ in pulses), and to sweep the surface of the sample to be treated by a series of laser impacts of very small width (1 $\mu$m). The lines thus swept overlap partially and thus cover, by degrees, the entire surface needed to be illuminated.

However, this solution has the drawback of requiring thousands of laser impacts on a single substrate, and therefore a high rate of operation of the laser (at least 500 Hz) in order to obtain a reasonable total operating time. This rate is critical for the maintenance and service life of the equipment, in particular, the consumable components.

In order to provide a homogeneous treatment over large surfaces, it is also known to use a high-power excimer laser, for example an excimer laser with pre-ionisation by X-rays supplying an effective power of 1 kW (10 J×100 Hz or 13 J×80 Hz). This type of laser makes it possible to obtain a high-power laser beam with a lower repetition rate than those previously described, which allows laser treatment over a large surface, even up to the entire surface of each panel, in a single laser pulse.

The remainder is placed in this context. As already indicated, "surface field" refers to the whole of the sample part to be treated; "zone" refers to the part of this field treated in one pass of the laser. In addition, "two generally similar surface fields to be treated" means two surface fields which belong either to two separate panels, which are generally similar; or to the same panel.

This problem, consisting of perfectly controlling the physical process of fusion/crystallization by laser pulses on at least two generally similar surface fields is resolved according to the present invention by a method which comprises at least one ellipsometry measurement performed at at least one zone of the first surface field (at one or more wavelengths, or else spectroscopic) before the treatment of the second surface field by laser, in order to obtain a physico-chemical characterization of the first surface field, and a monitoring in real time, on site, which is both nondestructive and rapid, of the laser surface treatment as a function of the physico-chemical characterization.

With reference to FIG. 1, the device implementing the method according to the invention comprises a laser source LA having a power supply SLA and a plurality of excimer laser heads, individualized at LA1 to LA3. The laser heads are of high power and are positioned so as to produce a single laser beam of very high power, for example 45 J. The head LA1 is depicted in bold lines while the heads LA2 and LA3 are depicted in broken lines since they are optional. The laser source or sources are of the XeCl type, with a wavelength of 308 nm, for example.

The laser source is described in the patent application entitled "Method and Device for Controlling a Laser Source with Several Laser Units in Order to Optimise Laser Surface Treatment", filed by the Applicant on the same date as the present application, French Patent No. 9509780, and is incorporated herein by reference.

Most advantageously, the laser beam is adapted to the desired zone size and at the same time homogenized by a micro-lens device HO described in detail in the patent application entitled "Optical Device for Homogenizing a Laser Beam", filed by the Applicant on the same date as the present application, French Patent No. 9509781, and is incorporated herein by reference.

The installation is completed by an electronic management system GES1 and GES2 controlling a robot RO which moves the panels, PA1 to PA3, a table TAB with x, y and z axes, and an ellipsometer EL, which can be spectroscopic. This ellipsometer EL can effect both the monitoring of the positioning of the panels with respect to the laser beam, and the real-time monitoring of the development of the laser treatment of the panels.

Spectroscopic ellipsometry is a nondestructive optical method of characterization of multilayer stacks, applicable in layers with fairly large thickness, ranging from 0.1 nanometers to 10 $\mu$m.

The measurement is based on the variation in polarization of a beam of light after reflection on the surface of the sample to be analyzed. The thicknesses are arrived at by considering the contrast in indices between layers of different materials.

Advantageously, the physico-chemical characterization of the surface field comprises the measurement of at least one of the parameters belonging to the group formed by the thickness of the surface field, both the density and the optical index of the surface field, the thickness of the different layers constituting the surface, and the physico-chemical composition of the surface field. A set of quantities measured, for a given application, can be referred to as the "multiplet of physico-chemical characteristics".

Figure 2:
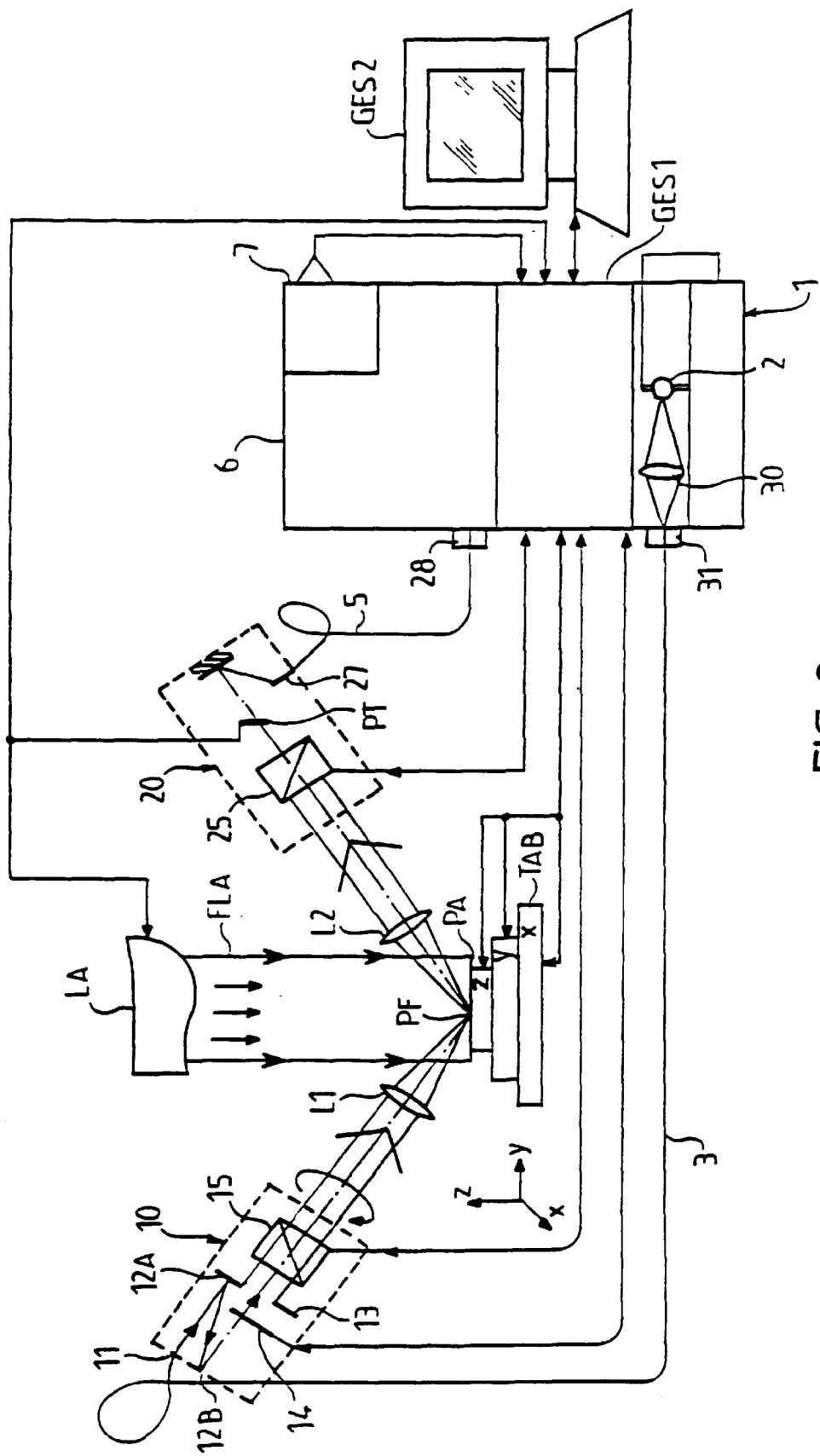
FIG. 2 is a schematic representation of a spectroscopic ellipsometer associated with a surface treatment by excimer laser according to the invention.

With reference to FIG. 2, the reference EL designates a spectroscopic ellipsometer, for example, the one sold by the Applicant under the commercial references ES4G, MLM, or GESP5. Such an ellipsometer is described, at least in principle, for example, in French Patent No. 8603188 (FR-A-2 595 471).

A power supply 1 excites a light source 2, such as a high pressure xenon arc lamp. A first optical system 10, including means 15 able to act on the polarization, transforms the light beam coming from the source 2 into a beam which strikes a panel PA mounted on the table TAB, preferably movable in three directions orthogonal to each other (X, Y and Z).

The useful light is that reflected by the panel symmetrically to the incident beam with respect to a normal to the surface of the panel.

The reflected light is taken up by a second optical system 20 comprising an analyzer 25, in order to be applied to the entrance slot of a prism monochromator 6. The light coming from the exit slot of the monochromator 6 is applied to a photodetector 7 comprising an array of photodiodes, for example 512 or 1024 pixels, making it possible to effect the wavelength detection (or else a single-way 35 photodetector, in the case of a non spectroscopic ellipsometer).

An electronic control unit GES1 acts:
on the polarization means 15, in order to control its effects on the polarization of the incident light (in the presence of polarization means of the rotary polarizer type, the electronic control unit acts on the continual setting in rotation of the polarizer);
on the table TAB, in order to control its positioning with respect to X-Y-Z;
on the robot RO in order to control first of all the extraction of a panel to be treated from the storage rack in which the panels to be treated are stored, then the movement of the panel thus extracted to the table, then the positioning of the said panel on the table at a chosen location and, after the ellipsometry (at one or more locations), the gripping of the panel in order to replace it in the initial storage rack or in another storage rack;
on the analyzer 25, in order to control its orientation through a stepping motor;
on the monochromator 6, in order to define its tuning wavelength; and
on the laser source LA, in order to control its flux according to the invention.

The signal coming from the photodetector 7 is applied to the management means GES1 in order to be recorded in connection with the state of polarization of the incident light (for example, the angle of the polarizer 15 in the case of a rotary polarizer), and other data collected, including notably the position of the panel to be treated, that of the analyzer and the wavelength to which each measurement corresponds.

This information, optionally pre-processed by the electronic unit GES1, is transmitted to a processing scheme GES2, such as a microcomputer, which derives therefrom the ellipsometry information (for example "tangent psi" and "cosine delta"), then provides plots representing the surface state and/or the multilayer structure of the panel to be treated, as a function of each impact position of the ellipsometry analysis spot.

A chassis, preferably a single one, comprises the power supply 1 of the xenon lamp 2, a management scheme GES1, the monochromator 6, the detector 7 and if applicable the processing scheme GES2.

In practice, the light radiation of the source 2 is transmitted by a lens 30 to the entrance coupler 31 of an optical fiber 3. This joins the optical system 10, which comprises a fiber exit coupler 11, two return mirrors 12A and 12B, a collimation diaphragm 13, an obturator 14 and the polarizer 15.

The parallel beam from the polarizer 15 is focused by a convergent lens L1 on a focal point PF of the panel to be treated. The lens L1 is disposed at the object plane of the panel.

The reflected radiation is focused by another convergent lens L2 on the entrance coupler 27 of the second optical fiber 5. The lens L2 is disposed at the image plane of the panel. The lenses L1 and L2 are optically connected.

The exit coupler 28 of the optical fibre 5 delivers radiation taken up by a lens so as to be applied to the entrance slot of the monochromator 6.

The detector 7 is opposite the exit slot of the monochromator.

The optical assembly consisting of the lenses L1 and L2 eliminates the interference reflection caused routinely by the rear face of a sample comprising a glass substrate with a large thickness.

The mechanical elimination of the contribution of the rear face of the sample is described in detail in the patent application entitled "Ellipsometer Device with High Spatial Resolution", filed by the Applicant on the same date as the present application, French Patent No. 9509779 and is incorporated herein by reference.

In addition, the error in positioning the wafers on the Z axis is critical because of the spatial resolution of the spot. This positioning error is corrected as follows.

Firstly, the curvature of each type of panel in the vertical direction Z is taken into account by making an adjustment, manual or other, of the ellipsometry spot.

The adjustment is then stored to memory, for the different zones of the panel intended to be analyzed by ellipsometry. In addition, the cartography of the profile of each type of panel is stored to memory in the computer GES2 (it is derived from the adjustments related to curvature).

Secondly, in the remainder of the process of monitoring the laser surface treatment, the positions of impacts thus adjusted and stored are reused at each analysis position. They can also serve for use in a subsequent laser treatment.

However, this is not always sufficient since differences in deformations can occur between panels of the same type.

A fine adjustment of the position of the spot on the exit fiber 5 is obtained by rotating a transparent plate PT disposed between the analyzer 25 and the entrance coupler of the optical fiber 5. This rotation is controlled by the management scheme GES1 so as always to be at the signal maximum on the photodetector array 7.

This last solution is also described in the patent application filed by the Applicant for an "Ellipsometer Device with High Spatial Resolution", mentioned previously.

In annealing by single-pulse excimer laser, the laser pulse FLA is of a very short duration, for example less than 200 nanoseconds. Such a pulse very rapidly supplies sufficient energy to reach partial or total fusion of a layer of amorphous silicon: the absorption of the laser beam being complete after 0.2 microns penetration, the heating (with recrystallization) is first of all limited to the front surface, namely the one receiving the laser impact; it next extends to the whole of the layer, either by simple thermal diffusion or by a so-called "explosive" crystallization phenomenon.

The energy threshold per unit surface needed to obtain the fusion of the front surface of the layer of amorphous silicon is here less than 400 mJ/cm$^2$. Above this energy, the layer of silicon is subject to a more extensive partial fusion. At 500 mJ/cm$^2$, the fusion is total and the energy added above this is no longer useful for improving recrystallization. It can even be harmful, since the layer of amorphous silicon can also melt with an excessively high absorption of energy, beyond 800 mJ/cm$^2$.

This shows the advantage of obtaining, during laser treatment, a characterization of the structure of the surface to be treated by ellipsometry, with a view to optimizing said laser surface treatment.

In addition, the quality of the polysilicon obtained depends mainly-on the size and arrangement of the grains of the silicon, and therefore on the crystallization process itself.

However, the average size of the polysilicon crystals obtained depends on the laser energy applied.

This is because the large crystals, which are the most favorable to an optimum functioning of the device, are obtained in a very narrow range of flux (or energy per unit surface). This range corresponds to the operating conditions of the laser, which make it possible to melt the layer of amorphous silicon almost entirely, while preserving a few unmelted grains of polysilicon. These grains fulfill the role of crystallization precursors in the progressive recrystallization of the melted layer and thus promote the appearance of large crystals. On the other hand, in the case of complete and/or free fusion of the layer, these precursors disappear, and the size of the grains obtained falls abruptly by one or two orders of magnitude.

These observations on the critical character of the crystallization process highlight the interest and advantages afforded by the present invention.

Advantageously, the monitoring method according to the present invention also comprises a step in which provision is made for optimizing at least some of the laser processing parameters according to a predetermined law dependent at least partly on the physico-chemical characterization of the surface obtained by ellipsometry measurement.

The essential parameters of the laser treatment to be monitored from the teachings of the present invention are the flux of the laser and the thickness of the layer of amorphous silicon to be treated by laser. However, apart from the laser flux and the initial thickness of the layer of amorphous silicon, other parameters can act in the monitoring process.

In some cases, the structure of the material to be annealed can be more complex than a simple layer of amorphous silicon on a glass substrate. This is the case when a transparent layer is provided (at the laser emission spectral band) and judicious choice of its thickness makes it possible, by simple optical effect, to substantially increase the efficacy of the laser treatment. For example, the use of a layer of glass of suitable thickness, for example 48 nanometers, makes it possible to increase the effective absorption of the layer of amorphous silicon from 0.42 to 0.68, that is to say a gain in surface area treated of approximately 50% for an equal initial energy. In addition, the use of a silicon $Si_3N_4$ glass instead of a $SiO_2$ glass is even more favorable since the gain in surface area treated is greater than 100%.

The counterpart of the presence of such a nonreflecting layer is to make the process more complex and more difficult to control, since the optimum influence will depend also on the thickness of the nonreflecting layer, and this in a critical fashion.

In addition, preheating of the layer to be treated by conventional means at a reduced temperature, for example 250 to 400° C., advantageously makes it possible to appreciably reduce the flux required for recrystallization. The size of the polycrystals obtained are slightly increased. However, the process is then more critical than when the laser treatment is carried out at room temperature.

Advantageously, the monitoring method according to the present invention makes it possible effectively to monitor the preheating step by means of ellipsometry measurements.

It should be noted that the amorphous silicon deposited by low-temperature techniques, such as PECVD ("Plasma Enhanced Chemical Vapor Deposition") is rarely free of hydrogen. This is due to the use of a mixture of silane-based gas for depositing this type of layer results and it is difficult to remove the hydrogen (which is always present in large quantities in the reactors as by-products of the decomposition of the silane).

Moreover, the treatment by excimer laser, without any precaution, of a layer of amorphous silicon which is highly contaminated with hydrogen, is generally catastrophic. The abrupt release of hydrogen during the fusion/crystallization process geneally leads to a veritable explosion of the layer and/or to an increased final surface roughness, which is completely incompatible with the desired performance.

In this case, one solution consists of effecting a treatment in two steps. First of all, a low-energy impact laser is first applied so as to release the hydrogen without fusion, even partial, of the layer of amorphous silicon. Next, the recrystallization process is effected during a second laser impact of higher power than the first its power is to be adjusted having regard to the effects of the first laser impact).

The on-site monitoring method by spectroscopic ellipsometry according to the invention described here finds another advantageous application in the treatment of a layer of silicon contaminated with hydrogen.

Generally, a spectroscopic ellipsometry measurement before laser annealing makes it possible to measure precisely, according to the invention, the following parameters:

the thickness of the layer of amorphous silicon (the thickness used is situated between 30 and 80 nanometers) and in this range of thicknesses, the accuracy of the ellipsometry is better than 0.5%;

the thickness of the nonreflecting layer (the accuracy is comparable with or better than that obtained on the layer of amorphous silicon); and the optical index of the layer of amorphous silicon (the presence of inserted hydrogen in the layer of amorphous silicon gives rise to a decrease in the optical indices which is perfectly detectable in spectroscopic ellipsometry).

The use of a spectroscopic ellipsometer before any treatment makes it possible thus to obtain, according to the present invention, a complete image of the structure of the samples, both in terms of the thickness and with regard to the physico-chemical composition of the layers of amorphous silicon.

In addition to the crystallinity of the layers, it is possible to determine the roughness of the surfaces of the samples. This is because the appearance of a surface roughness (in particular after treatment) can be detected since it causes a deformation of the ellipsometry curves which is different from that caused by a variation in thickness. This feature is very important for monitoring the panel manufacturing process described below.

The starting point includes glass panels covered with a small thickness of amorphous silicon which are substantially identical, in terms of their manufacture (the same series). Preferably, the annealing monitoring method comprises initially a test procedure followed by an annealing procedure.

The test procedure comprises the following steps:

a) providing several test panels and effecting, for each of them, an ellipsometry measurement at the positions of the centers of future laser impacts;

b) providing a step of regression (or other statistical processing) of the different measurements and evaluating the average structure of the panels (it should be noted that, in this application, the parameters which are most particularly evaluated are the thicknesses of the layers, the dielectric constants of the amorphous silicon and the homogeneity of the panels for the amorphous silicon and the nonreflective layer as appropriate);

c) estimating the average energy of the laser needed for the structure thus considered;

d) treating several test panels with energies in the range having a value of around 0.5 times the average energy up to a value of around 1.5 times the said average value; and e) where applicable, effecting an ellipsometry measurement on the same panels after laser treatment. Advantageously, this is supplemented with a step of regressing the measurements, and an evaluation of the results, in order to determine the crystallinity as a function of the energy of the laser, the exactitude of the regressions (as a whole) and the presence of any roughness.

This test procedure results in a precise evaluation of the optimum energy; needed to crystallize the structure under consideration. In the ideal case, this evaluation can be validated by complementary physical measurement such as resistivity, crystallinity (by X-rays).

According to the present invention, the incident power of the laser is adjusted either by direct action on the laser pulse or by an energy variator such as an optical attenuator (diaphragm, absorbent sheet), a variator for the supply voltage of the laser source or for the distance between the two collecting lenses of the homogenizing optical device.

EXAMPLES

In the case of a simple amorphous silicon structure, for example with a thickness of 45 nanometers and glass treated at ambient temperature, the measurement by ellipsometry before treatment gives a thickness of amorphous silicon of 45 nanometers with a variance of around 10% due to the heterogeneity of the deposition. The presence of a thin layer of native oxide on the surface, for example of around 2.2 nanometers, must be taken into account for a correct adjustment of the measurements. The mean index of the amorphous silicon specific to this type of sample is then extracted and compared with the reference indices. In this specific case, the index found is very close to that of a dense amorphous silicon, and therefore not very liable to contain a great deal of inserted hydrogen. A conventional treatment including a single laser pulse can therefore be optimized.

A certain number of samples are next annealed by laser with fluxes that vary from 250 to 370 mJ/cm$^2$. These samples are analyzed by ellipsometry. By regression, using the index of the previously extracted amorphous silicon, the crystallinity of various samples is deduced.

Figure 3:
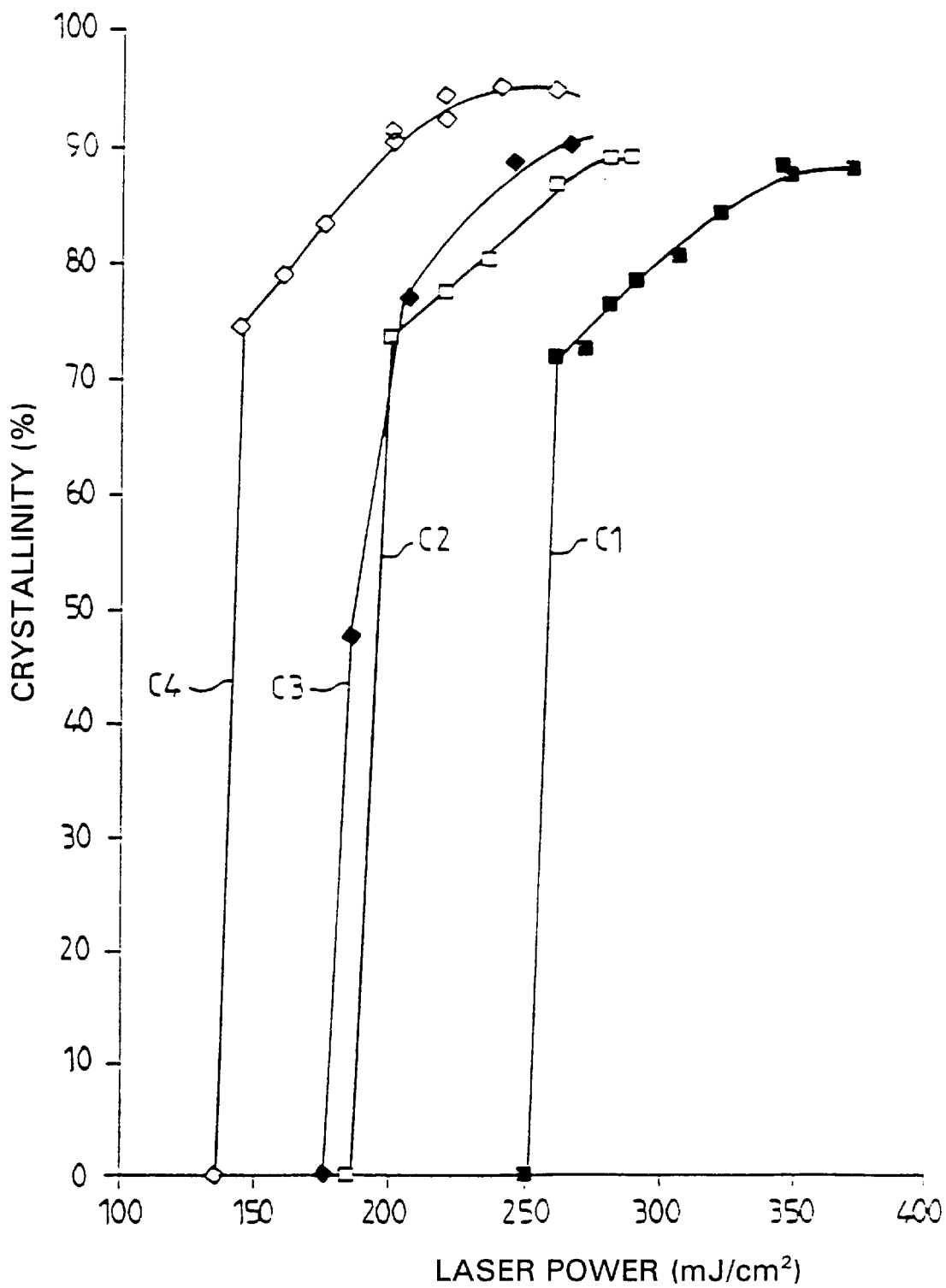
FIG. 3 depicts crystallinity curves of the laser annealing of several types of samples (with or without the nonreflecting layer) performed at room temperature or at 240° C. according to the invention.

The crystallinity curve C1 (FIG. 3) shows the presence of a highly marked crystallization threshold at approximately 255 mJ/cm$^2$. This is, in fact, the energy threshold necessary for partial fusion of the layer of amorphous silicon at room temperature. Below this threshold, the entire layer of silicon appears partially crystallized. The crystallization rate increases progressively up to energies sufficient for the whole of the layer to fuse. This change is to be related to the description of the process given previously. The optimum treatment is reached when the crystallinity level measured by spectroscopic ellipsometry is at a maximum, of 350 mJ/cm$^2$. This optimum corresponds to the best adjustment of the model to a simple homogeneous 10 layer, in the example chosen.

In another example (curve C3), the samples have a nonreflective layer of silicon with a thickness of around 55 nanometers, deposited on the layer of amorphous silicon. The optimization process is effected in the same way as before, and the energy range chosen is smaller because of the presence of the nonreflective layer. The same type of analysis after laser impact gives a crystallinity curve similar to the previous one, but very appreciably offset towards the low energies. The optimum energy is reduced to approximately 260 mJ/cm$^2$, which corresponds to the energy gain introduced by a simple optical effect.

It should be noted that monitoring by spectroscopic ellipsometry is particularly interesting in the complex case with a nonreflective layer. This technique also gives precisely the thickness of the nonreflective layer. In other applications, ellipsometry with one or several wavelengths may suffice.

In addition, the same types of sample with and without nonreflective layer have also been annealed by laser under vacuum by raising the temperature of the substrate to approximately 240° with impact. The same types of analyses give results (curves C2 and C4) set out in FIG. 3. Compared with the results obtained at room temperature, preheating the substrate again makes it possible to reduce the optimum energy required for crystallization by approximately 50 mJ/cm$^2$. The best results in terms of crystallinity are apparently obtained at 240° C. in the presence of a nonreflective layer (curve C4). In addition, the optimum energy needed is the lowest, below 240 mJ/cm$^2$, which highlights these parameters.

After the test procedure designed to optimize the energy of the laser beam, the monitoring of the annealing proper can be set up.

Figure 4:
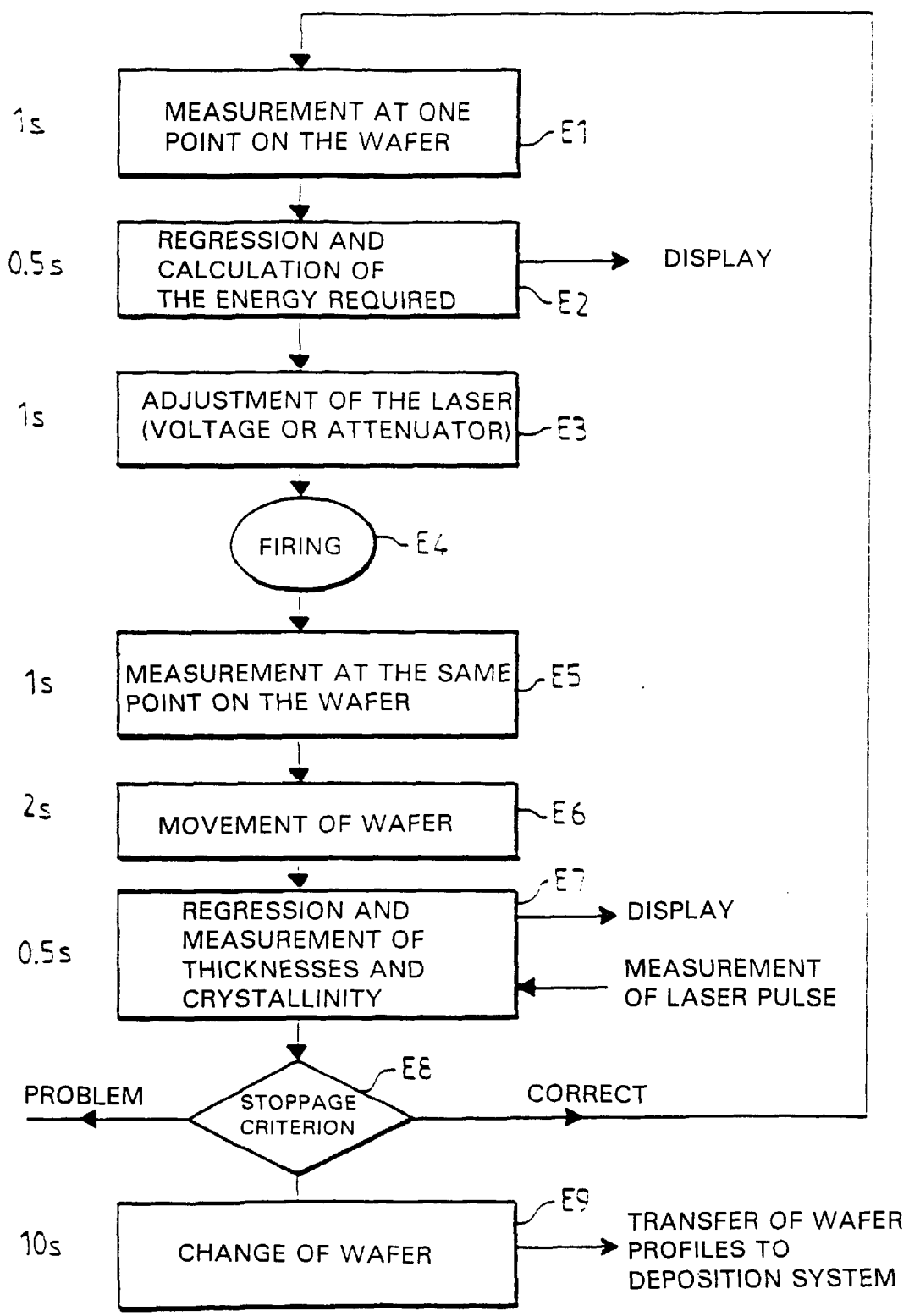
FIG. 4 is a flow diagram illustrating the functioning of the monitoring of the annealing of amorphous silicon panels by excimer laser according to the invention.

With reference to FIG. 4, the method of monitoring the laser annealing comprises the following steps (for each laser impact on a panel):

Step E1: first ellipsometry measurement (duration of around 1 sec, with adjustment for height and fine setting, as well as rapid acquisition);

Step E2: regression and calculation of the laser energies (duration of 0.5 secs);

Step E3: adjustment of the laser energy (duration 1 sec);

Step E4: laser firing;

Step E5: where applicable, second ellipsometry measurement (duration 1 sec);

Step E6: movement of the panel to the following position;

Step E7: regression and evaluation of crystallinity;

Step E8, final treatment test; and

Step E9: change of panel or wafer, and return to step E1.

For example, the period of repetition of the laser impacts is 6 secs and a panel of 40×30 cm is treated in 9 pulses, that is to say, a treatment capacity of around 50 panels per hour, for the times indicated.

Thus the method described not only improves the quality and reliability of the laser annealing of amorphous silicon, but also allows monitoring of the step of deposition of the amorphous silicon, whose homogeneity is not always perfect.

In so far as, for example, it is possible to sacrifice samples, as described above, the method described can be implemented only after the laser surface treatment. However, it is currently preferred for it also to be carried out before this surface treatment, at least for some applications. In other applications, it will only be carried out before the laser surface treatment.

In its developed version, the method can be defined in other terms as follows:

a) effecting, before said laser surface treatment, at least one ellipsometry measurement on one of the zones to be treated of a panel immobilized in an initial position defined by three coordinates relative to an orthonormal reference frame (X, Y, Z), in order to obtain a multiplet of physico-chemical characteristics of its surface;

b) determining the energy of the laser beam necessary for the treatment, as a function of at least the multipier of characteristics obtained at step a and a look-up table stored to memory;

c) effecting a laser firing with an energy determined at step b in order to treat the surface of the zone;

d) moving the panel in a plane XY so that another zone is positioned opposite the laser beam; and e) recommencing the method at least at step c.

Better still, at step a, an ellipsometry measurement is carried out on each zone to be treated on the panel, in order to obtain the multiplet of physico-chemical characteristics of the surface of each zone to be treated, while at step b the energy of the laser beam needed for the treatment is determined according to all the multiplets of characteristics obtained at step a.

As applicable, at step d, the positioning comprises a sub-set d1 in which an ellipsometry measurement is effected on the zone, in order to adjust its positioning according to a direction Z.

According to a variant, between steps d and e an intermediate step d' is provided in which the energy of the laser needed for the surface treatment of the zone is adjusted, according to the energy determined at step b, the position adjustment effected at sub-step d1 and the look-up table.

According to another variant, between steps c and d, a sub-step c' is provided in which an ellipsometry measurement of the treated surface is effected, in order to determine the new characteristics of the multiplet.

In its complete version, the method can be defined as follows:

a) performing an ellipsometry measurement on each zone to be treated on a panel immobilized in an initial position, before said laser surface treatment, in order to obtain a multiplet of physico-chemical characteristics of the surface to be treated on each zone, b) evaluating the mean energy of the laser necessary for the mean surface treatment of the panel, as a function of the characteristics obtained at step a and a look-up table stored to memory; and next, for each zone to be treated:

c) effecting a new ellipsometry measurement on the zone, in order to adjust its positioning with respect to the initial position, d) adjusting the energy of the laser needed for the surface treatment of the zone, as a function of the mean energy evaluated at step b, the position adjustment effected at step c and the look-up table, and e) effecting a laser firing with an energy determined at step d in order to treat the zone.

In all embodiments of the method, the invention can also be defined in the same way in the form of a corresponding device, and vice-versa.

What is claimed is:

1. A method of laser surface treatment, wherein there is a series of at least a first zone and a second zone, substantially similar from a physico-chemical point of view and each comprising a layer of silicon, of given depth, and on each of which there is to be applied, on one or more occasions, a laser beam with an energy chosen for recrystallizing the layer of silicon in each of the first and second zones, the method comprising:

a) effecting, before at least one of the applications of the laser beam to the first zone, at least one ellipsometry measurement on the first zone, in order to obtain a multiplet of physico-chemical characteristics of the first zone;

b) determining the energy of the laser beam necessary for the recrystallization of the layer of silicon in the first zone, as a function at least of the multiplet of characteristics obtained at step a and a look-up table;

c) effecting, on the first zone, at least one laser firing with an energy determined at step b;

d) positioning the second zone opposite the laser beam; and e) effecting, on the second zone, at least one laser firing with an energy determined at step b, which makes it possible to optimize the process of recrystallization of the layer of silicon by the laser treatment on the first and second zones and controlling the application of the laser energy as a function of the ellipsometry measurement.

2. A method according to claim 1, wherein at step a an ellipsometry measurement is made at least also on the second zone to be treated, in order to obtain the multiplet of physico-chemical characteristics of the surface of the first and second zones to be treated, and in that at step b the determination of the energy of the laser beam necessary for the treatment is effected as a function of all the multiplets of characteristics obtained at step a.

3. A method according to claim 1, wherein, between steps d and e, an intermediate step d' is provided in which the energy of the laser necessary for the surface treatment of the second zone is adjusted as a function of the energy determined at step b, and as a function of the look-up table.

4. A method according to claim 1, wherein the first zone is immobilized in an initial position defined by three coordinates relative to an orthonormal reference plane (X, Y, Z), wherein at step d the positioning of the second zone comprises a movement of the second zone in a plane XY.

5. A method according to claim 1, wherein at step d the positioning of the second zone also comprises a sub-step d1 in which an ellipsometry measurement is made on the second zone, in order to adjust its positioning in a Z direction.

6. A method according to claim 3 wherein the adjustment of the laser energy necessary for the surface treatment of the second zone is effected as a function of the energy determined at step b, the position adjustment effected at sub-step d1 and the look-up table.

7. A method according to claim 1, wherein, between steps c and d, a sub-step c' is provided in which an ellipsometry measurement is made on the first zone treated, in order to determine new characteristics of the multiplet.

8. A method according to claim 1, wherein the ellipsometry measurement is spectroscopic.

9. A method according to claim 1, wherein the ellipsometry measurement is made at one or more wavelengths.

10. A method according to claim 1, wherein the physico-chemical characterization of each zone by ellipsometry comprises a measurement of at least one of the parameters selected from the group consisting of the thickness of the zone, the density and optical index of the zone, the thickness of the different layers present in the zone, and the physico-chemical composition of the zone.

11. A method according to claim 1, wherein each zone to be treated comprises a layer of amorphous silicon deposited on a glass substrate and a top layer consisting of a material having nonreflective optical characteristics deposited on the layer of amorphous silicon opposite the substrate.

12. A device for laser surface treatment, in which there is a series of at least a first zone and a second zone, substantially similar from the physico-chemical point of view and each comprising a layer of silicon, of given depth, and on each of which there is to be applied, on one or more occasions, a laser beam treatment with an energy chosen for recrystallizing the layer of silicon in the first and second zones, said device comprising an ellipsometer (EL) suitable for effecting, before at least one of the applications of the laser beam to the first zone, at least one ellipsometry measurement on the first zone, in order to obtain a multiplet of physico-chemical characteristics of the first zone, a calculation scheme (GES1, GES2) for determining the energy of the laser beam necessary for recrystallization of the layer of silicon in the first zone, as a function at least of the multiplet of characteristics thus obtained and a look-up table, a laser application (LA) for effecting, on the first zone, at least one laser firing with an energy determined by the calculation scheme, a table (TAB) for positioning the first and second zones opposite the laser beam, the laser application (LA) being suitable for effecting, on the second zone, at least one laser firing with an energy determined by the calculation scheme on the first zone, which makes it possible to optimize the process of recrystallization of the layer of silicon by the laser surface treatment on the zones to be treated by controlling the application of the laser energy as a function of the ellipsometry measurement.

* * * * *